(12) United States Patent
Nguyen et al.

(10) Patent No.: US 6,556,105 B1
(45) Date of Patent: Apr. 29, 2003

(54) SURFACE WAVE DEVICE CONNECTED TO A BASE WITH A CONDUCTIVE ADHESIVE

(75) Inventors: Ngoc-Tuan Nguyen, Mougins (FR); Jean-Marc Bureau, Valbonne (FR); Christian LeLong, Vallauris (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/890,280

(22) PCT Filed: Feb. 11, 2000

(86) PCT No.: PCT/FR00/00347
§ 371 (c)(1),
(2), (4) Date: Aug. 10, 2001

(87) PCT Pub. No.: WO00/48313
PCT Pub. Date: Aug. 17, 2000

(30) Foreign Application Priority Data

Feb. 12, 1999 (FR) .............................. 99 01722

(51) Int. Cl.$^7$ .................... H03H 9/64; H03H 3/08; H03H 9/05
(52) U.S. Cl. .................... 333/193; 310/313 B; 310/340; 310/348
(58) Field of Search .................... 333/193–196; 310/313 R, 313 B, 313 C, 313 D, 348, 349, 340

(56) References Cited

U.S. PATENT DOCUMENTS

| | | | |
|---|---|---|---|
| 4,768,130 A | 8/1988 | Bernard et al. | 361/323 |
| 4,855,022 A | 8/1989 | Poupard et al. | 204/130 |
| 5,235,463 A | 8/1993 | Broussoux et al. | 359/642 |
| 5,262,351 A | 11/1993 | Bureau et al. | 437/183 |
| 5,418,365 A | 5/1995 | Robin et al. | 250/338.2 |
| 5,437,195 A | 8/1995 | Bureau et al. | 73/862.28 |
| 5,618,737 A | 4/1997 | Robin et al. | 216/56 |
| 5,774,960 A | 7/1998 | De Fraguier et al. | 29/25.35 |
| 5,908,304 A | 6/1999 | Oudart et al. | 438/109 |
| 5,939,817 A | 8/1999 | Takado | 310/348 |
| 6,044,533 A | 4/2000 | Bureau et al. | 29/25.35 |
| 6,287,894 B1 * | 9/2001 | Sawin | 438/113 |
| 6,492,194 B1 | 12/2002 | Bureau et al. | 438/106 |

FOREIGN PATENT DOCUMENTS

| | | |
|---|---|---|
| EP | 0 840 369 | 5/1998 |
| EP | 0 896 427 | 2/1999 |
| JP | 9-162693 | * 6/1997 |

OTHER PUBLICATIONS

Y. Kishimoto, et al., Proceedings of 3$^{rd}$ International Conference on Adhesive Joining and Coating Technology in Electronics Manufacturing, pps. 137–143, "Anisotropic Conductive Paste Available for Flip Chip," 1998.

K. Ishibashi, et al., IEEE Transactions on Components, Packaging and Manufacturing Technology–Part B, vol. 19, No. 4, pps. 752–757, "A New Anisotropic Conductive Film with Arrayed Conductive Particles," Nov. 1996.

J. Liu, The First IEEE International Symposium on Polymeric Electronics Packaging, Pep "97, pps. 107–122, "Recent Advances in Conductive Adhesives for Direct Chip Attach Applications," 1997.

K. Gilleo, IEEE Transactions on Components, Hybrids, and Manufacturing Technology, vol. 13, No. 1, pps. 229–234, "Dircet Chip Interconnect Using Polymer Bonding," Mar. 1990.

* cited by examiner

Primary Examiner—Barbara Summons
(74) Attorney, Agent, or Firm—Oblon, Spivak, McClelland, Maier & Neustadt, P.C.

(57) ABSTRACT

The invention relates to a surface wave device linked to a base by a conductive material which is anisotropic in a direction perpendicular to the plane of the surface wave device and of the base. This anisotropic conductive material provides for the mechanical efficacy and the encapsulation of the surface wave device. It is deposited locally in the plane of the base, in such a way as to provide for the presence of a cavity in which the surface acoustic waves can propagate.

11 Claims, 4 Drawing Sheets

SURFACE WAVE DEVICE CONNECTED TO A BASE WITH A CONDUCTIVE ADHESIVE

The field of the invention is that of surface wave components used in the field of electronics, in particular as RF or IF filters for the purpose of selecting frequency bands.

BACKGROUND OF THE INVENTION

Field of the Invention

These components use the principle of acoustic propagation of surface waves, on the surface of a piezoelectric substrate. To ensure satisfactory surface acoustic wave propagation, the surface of the component must be protected against any contamination and any mechanical loading.

Furthermore, since the acoustic waves propagate on the surface of the piezoelectric substrate, this surface must be left free so as not to disturb the propagation of the waves, this constituting a further constraint at the level of the encapsulation packages.

The current technologies of encapsulation of surface wave filters rely on a two-part package, as illustrated in FIG. 1: a ceramic or organic base 01, and a ceramic, metal or organic cover 02, closure of which by welding or gluing ensures that the component is hermetically sealed while the necessary cavity is allowed for. In packages of this type, the surface wave devices (SAW) 03, can be assembled by gluing to the base. The electrical connections between the internal pads 011, 012 of the SAW and external pads 071 and 072 are provided for by metallized vias through the base 01.

FIG. 1 illustrates an example of the prior art, in which the electrical connections of the SAW with the exterior are of wire type. To provide better compactness, the "flip chip" type technique (the component being turned over) is currently employed. FIG. 2 illustrates an example of an encapsulated SAW according to the known art, which constitutes a variant of FIG. 1. The flip-chip type method is developed in detail in the U.S. Pat. No. 5,252,882. The SAW is transferred active face towards the base by way of metal beads known as "bumps" which provides both for the electrical connection between the SAW and the base and the mechanical efficacy of this assembly. However, the limited number and the small size of these beads limit the mechanical efficacy of the assembly.

This is the reason that some have proposed the use of an encapsulation resin for enhancing the mechanical efficacy of these beads which provide for the electrical connections between the SAW and the base. Such resins are described in particular in European Patent EP 0 896 427 A2.

SUMMARY OF THE INVENTION

In this context, the invention proposes a new surface wave component comprising an SAW mounted active face towards a base and assembled to the said base with the aid of an anisotropic conductive adhesive.

The anisotropic conductive adhesive advantageously provides for an electrical connection function.

More precisely the subject of the invention is an encapsulated surface wave component comprising:
- a surface wave device on the surface of a piezoelectric substrate, the so-called active surface, the said device comprising interdigital electrodes linked to conducting buses;
- a base comprising electrodes linked to external conducting pads;
characterized in that: the active surface of the surface wave device is assembled to the base by way of a conductive adhesive which is anisotropic along an axis Z perpendicular to the plane of the surface wave device, at the level of the conducting buses opposite the electrodes of the base in such a way as to provide for electrical connections.

According to a variant of the invention, the anisotropic conducting adhesive can also be situated on the entire periphery of the surface wave device in such a way as to achieve the encapsulation of the said device.

The electrodes of the base have a structure suitable for compressing the anisotropic conductive adhesive locally, a necessary condition for squashing the conducting particles. According to the invention, it is therefore unnecessary to make bumps on the base or on the SAW. This structure comprises a succession of local thickenings allowing local compression, possibly of the order of a few tens of microns.

According to a preferred variant of the invention, the anisotropic conductive adhesive is a composite material comprising conducting particles and a binder material.

According to a variant of the invention, the electrodes of the base constitute barriers against the creeping of the anisotropic conductive adhesive towards the active zones of the surface wave device. Advantageously these electrodes can be in the form of a comb whose teeth are perpendicular to the direction of propagation of the acoustic waves of the surface wave device.

BRIEF DESCRIPTION OF THE DRAWINGS

The invention will be better understood and other advantages will become apparent on reading the following description, given by way of nonlimiting example and by virtue of the appended figures, among which:

FIG. 3 illustrates the assembly procedure used in the invention.

DETAILED DESCRIPTION OF THE INVENTION

In general, the component of the invention comprises a surface wave device which has the feature of being mounted active face towards a base and assembled to this base, via an anisotropic conductive adhesive which provides both for an electrical function and a mechanical function. The same adhesive can also provide for an acoustic absorbent function.

Figure 1:
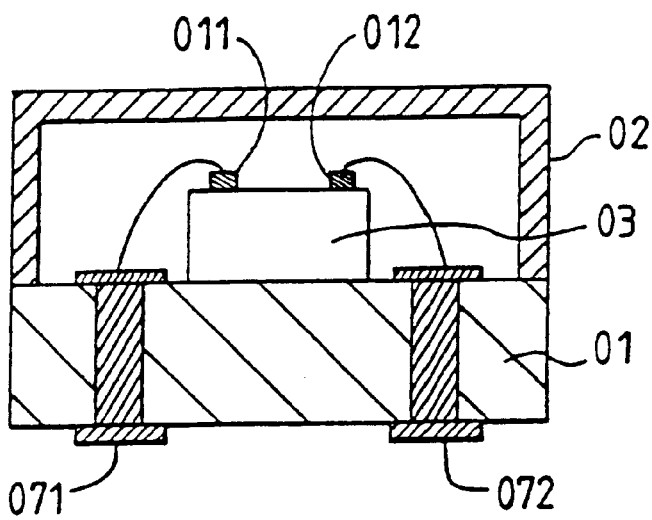
FIGS. 1 and 2 illustrate surface wave devices, encapsulated according to techniques of the known art.
Figure 2:
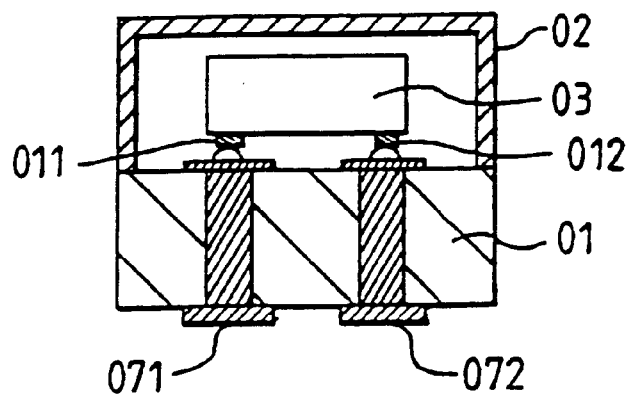
Figure 3A:
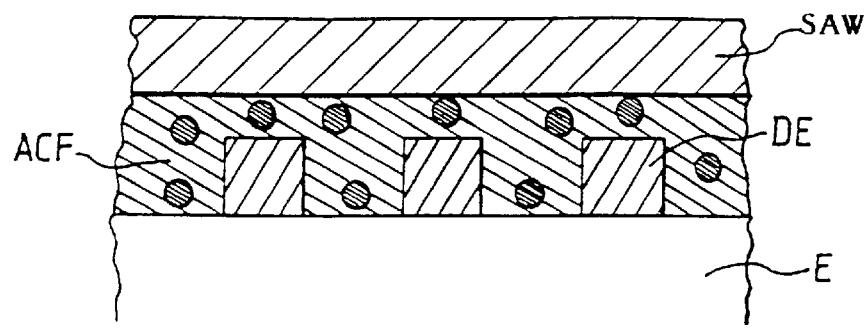
FIG. 3a shows the anisotropic conductive material unstressed between two electrodes.
Figure 3B:
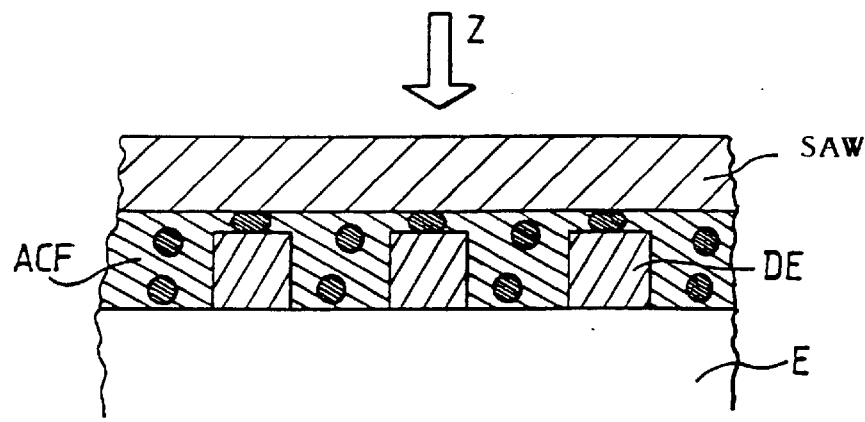
FIG. 3b shows the anisotropic conductive material under compression between two electrodes.

The anisotropic conductive adhesive material exhibits the property of being conducting in a favored direction, as illustrated in FIG. 3 which diagrammatically shows a conductive adhesive film consisting of a binder material and conducting particles. Typically, this material inserted between two electrodes, then hot pressed is able to provide for electrical contact, only along the Z direction. FIG. 3a shows the ACF film unstressed, FIG. 3b illustrates the operation of hot pressing which makes it possible to provide for the electrical contact between the two electrodes. More precisely these figures illustrate a variant in which the base E comprises electrodes in the shape of combs whose teeth DE are represented in section, opposite the electrode of the SAW. Electrical conductivity is achieved by squashing the particles in the z [sic] axis, corresponding to the axis of conduction, during transfer by pressure between the two surfaces to be assembled.

Within the framework of the invention, one of the electrodes, corresponds to that of the surface acoustic wave device, the other electrode can have been made on the surface of the base, as will be described in greater detail later.

To provide for the sought-after anisotropy of the material binding the two conducting surfaces to be connected, it is advantageously possible to use a thermosetting or thermoplastic polymer filled with polymer particles metallized by in particular deposition of gold or nickel. The size of the particles can vary between a few microns and about twenty microns. The density of the particles can typically be of the order of 1000 beads/mm$^2$ to 15000 beads/mm$^2$.

Within the framework of the invention, the anisotropic conductive material makes it possible to bind the acoustic wave device to a base.

Figure 4:
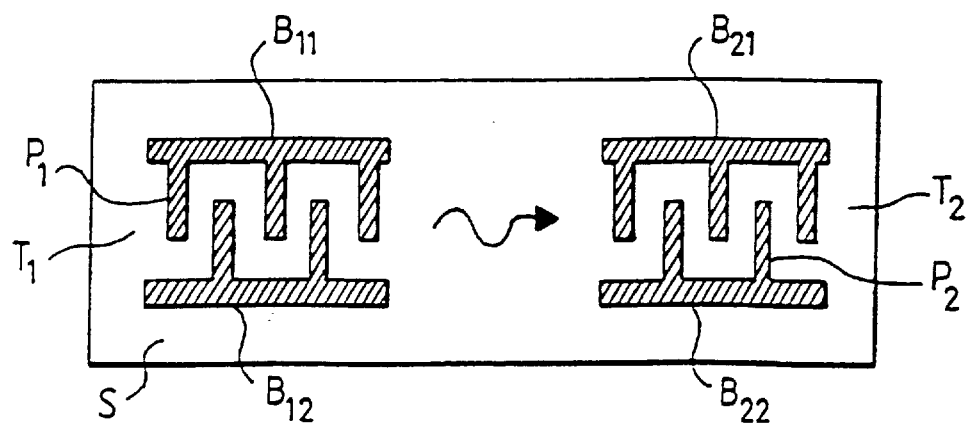
FIG. 4 illustrates an example of a surface wave device comprising two transducers.

In more detail, we shall describe an example of a surface acoustic wave device made on the surface of a piezoelectric substrate of quartz type, lithium tantalate, on which are made by vacuum evaporation, the interdigital electrode combs which constitute the active surface which generates acoustic waves, and buses generally made of aluminum which enable the combs to be powered electrically. An example of such a device is illustrated in FIG. 4. Two transducers $T_1$ and $T_2$ are made on the surface of the piezoelectric substrate, each respectively comprises two buses $B_{11}$, $B_{12}$, $B_{21}$, $B_{22}$ and electrode combs $P_1$ and $P_2$. The rear face of the surface wave device can be striated so as to absorb the bulk waves.

Figure 5A:
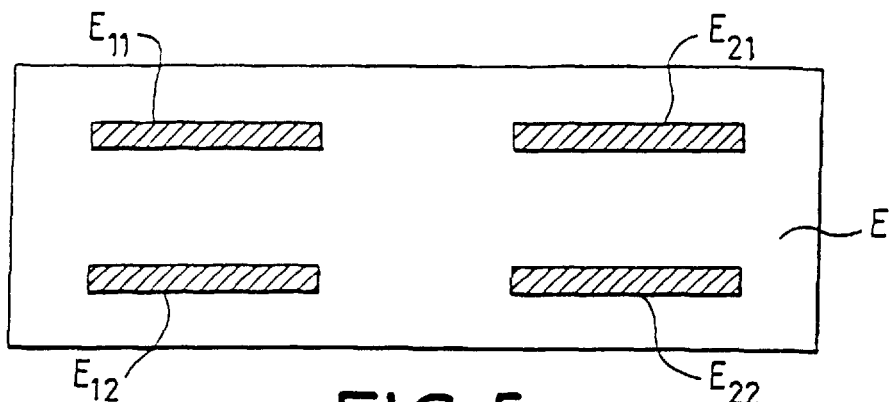
FIGS. 5a to 5c illustrate examples of a base which can be used in the invention.

The base E is represented in FIG. 5a. On one of its faces it comprises electrodes $E_{11}$, $E_{12}$, $E_{21}$, $E_{22}$ intended to provide for the contact of the buses $B_{11}$, $B_{12}$, $B_{21}$, $B_{22}$ of the transducers $T_1$ and $T_2$ previously described, and on the other face (not represented) conducting pads make it possible to provide for electrical contact with the exterior, possibly involving for example a printed circuit to be connected to the surface wave device. Conducting vias made through the base provide for the electrical link between the electrodes $E_{11}$, $E_{12}$, $E_{21}$, $E_{22}$ and the external conducting pads. In this technology, the base can be made from ceramic ($Al_2 O_3$) or from filled polymer (for example epoxy-glass resin) or else from a polyimide film (Kapton for example).

The function of the anisotropic conductive material is to mechanically assemble and electrically connect the acoustic wave device to the base. To do this, the anisotropic conductive material (ACM), can equally well be deposited base side or device side. When a film of ACM is chosen, it is in particular possible to use a preform precut mechanically, by laser or by any other method. When a paste is chosen, a deposition can be carried out by screen printing, syringe deposition. It is also possible to effect a deposition covering the entire surface of the substrate or of the base and then localized by chemical, mechanical etching or by laser ablation so as to clear the free space necessary for the propagation of the surface waves. In all cases, the material is deposited at the level of the opposite electrical connection lands (bus/electrodes of the base), but the anisotropic nature of the conductive material, allows deposition on more extensive surfaces than those to be connected, without short-circuiting the independent conducting lands, situated in one and the same plane. The material can in particular, advantageously be localized at the following sites:

On the nonactive surfaces of the surface wave device, so as to enhance the mechanical efficacy of the assembly by increasing the gluing area and by distributing the mechanical stresses.

On specific zones of the surface wave device, so as to absorb the surface acoustic waves if necessary (this may typically involve eliminating reflections from the edges of the device, elimination of acoustic coupling between various active zones).

Figure 6:
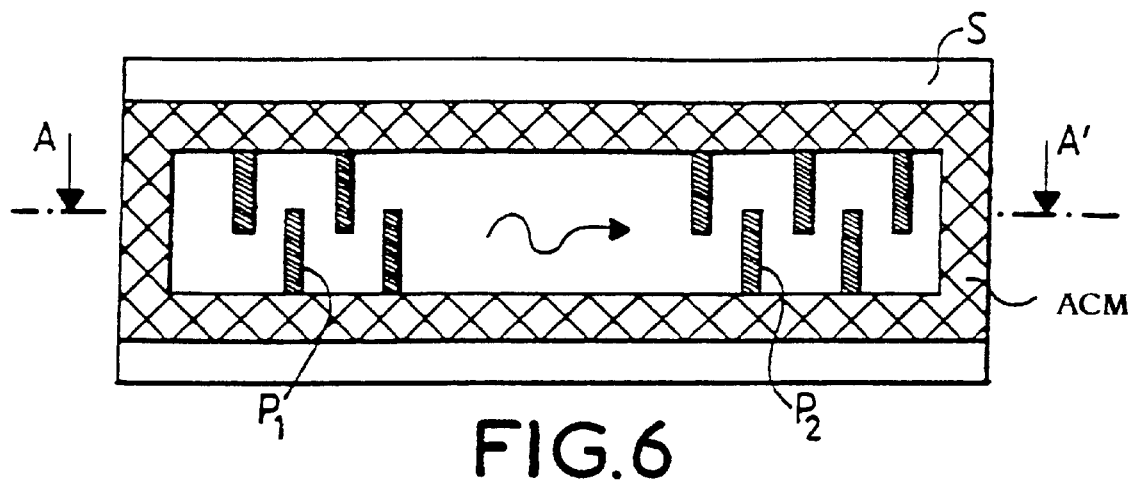
FIG. 6 illustrates an example of an anisotropic conductive material overlaid on a surface acoustic wave device.

Over the entire periphery of a surface wave device, so as to provide for the sealing thereof as illustrated in FIG. 6.

Moreover, to provide a gaged thickness of conducting anisotropic material, and to gage the height of the cavity thus defined, it is possible to use metal beads (known as bumps) deposited surface wave device side.

Figure 5B:
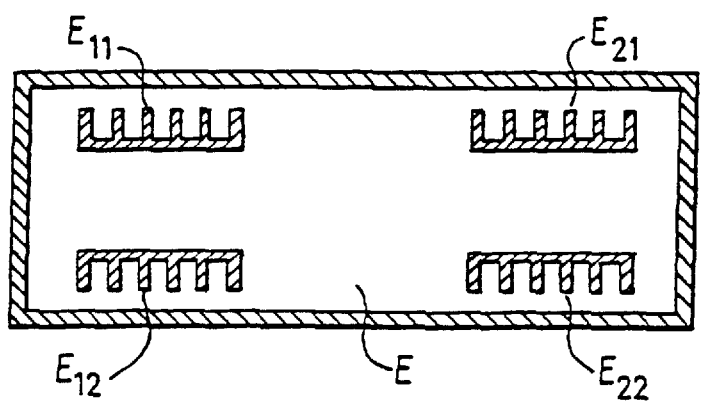
Figure 5C:
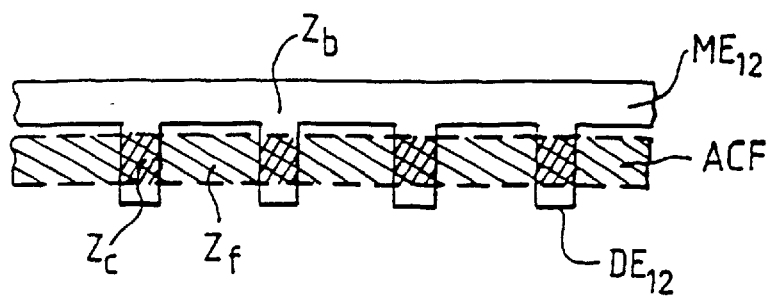

It is also possible to make structures in relief device side or base side so as to compress the anisotropic conductive adhesive locally, so as to control the creeping of the anisotropic conductive material and in particular prevent its migration towards the active surfaces of the device. This involves comb-shaped electrodes, as illustrated in FIG. 5b. Specifically, when making the base substrate assembly, the anisotropic conductor is advantageously placed on the fingers of the electrode combs. Under the effect of pressure and temperature, the creeping of the anisotropic conductor is arrested by the barriers constituted by the electrodes and more particularly the haft of the combs, as illustrated in FIG. 5c. The teeth $DE_{12}$ have a structure consisting of thickenings making it possible to compress the adhesive locally in the zones $Z_c$. According to the invention it is not therefore necessary to make bumps on the base or on the SAW. The zones $Z_f$ represent zones of creep in relation to the uncompressed conductive adhesive. The zones $Z_b$ constituted by the haft of the comb constitute barrier zones to the creeping of the anisotropic conductive adhesive ACF towards the active regions.

When the desired patterns are made at the level of the anisotropic conductive material, the three elements device/conductive material/base are assembled. This operation is performed at a temperature and at a pressure which are determined as a function of the kind of anisotropic conductive material. Typically, the pressure necessary to obtain the gluing and the establishment of electrical contact varies between 10 and 30 bar and the temperature varies between 150° C. and 220° C.

Figure 7:
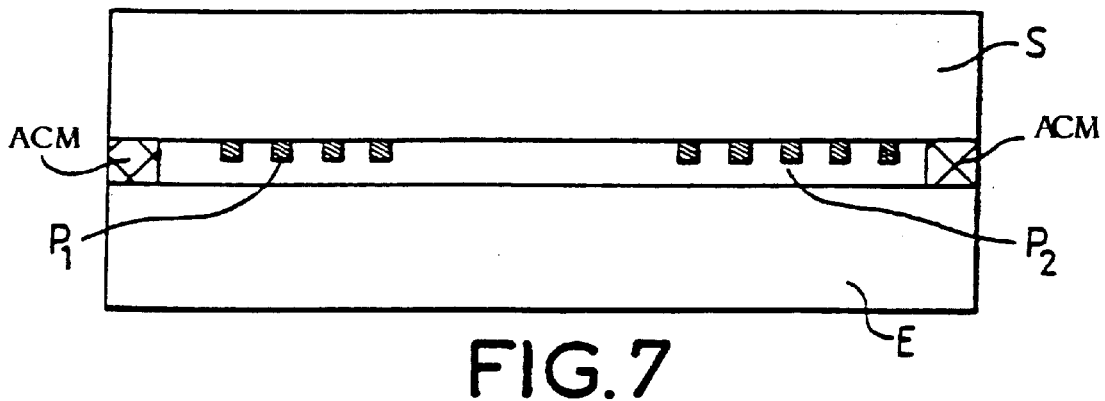
FIG. 7 illustrates an example of a device encapsulated according to the invention.

In the example cited above, the anisotropic conductive material also provides for a sealing function which makes it possible to design a particularly compact surface acoustic wave device since it exhibits no lost space as revealed by FIG. 7 which illustrates the device of FIG. 6 assembled to a base, in a sectional plane AA'.

Figure 8:
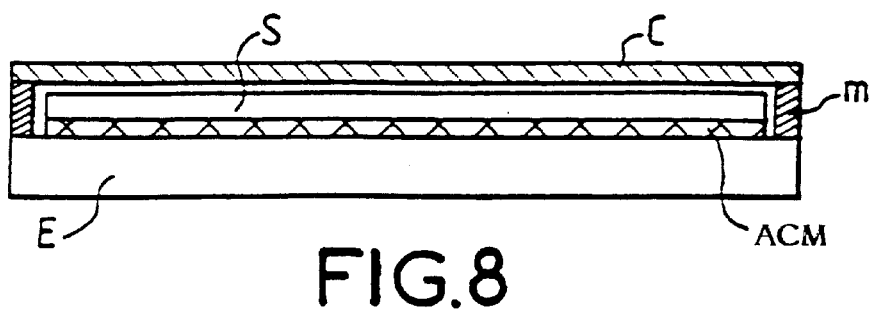
FIG. 8 illustrates an example of a device according/to the invention, encapsulated in a standard package.

For applications in which the sealing constraints and robustness constraints are very high, the assembly illustrated in FIG. 7 can equally well be integrated into a standard encapsulation package as shown diagrammatically in FIG. 8, the ACM material still provides for the electrical connection between the base and the surface acoustic wave device. Small walls m and a cover C constitute the upper part of the encapsulation package.

What is claimed is:

1. Encapsulated surface wave component comprising:
   a surface wave device on an active surface of a piezoelectric substrate, said surface wave device comprising interdigital electrodes linked to conducting buses;
   a base comprising electrodes linked to external conducting pads;
   wherein the active surface of the surface wave device is assembled to the base by a conductive adhesive which is anisotropic along an axis Z, perpendicular to a plane of the surface wave device, at a level of the conducting buses opposite the electrodes of the base in such a way as to provide for electrical connections, the electrodes of the base having structures in relief constituting barriers against creeping of the anisotropic conductive adhesive towards active zones of the surface wave device, with local thickenings configured to compress the anisotropic conductive adhesive locally.

2. Surface wave component according to claim 1, wherein the electrodes of the base have an architecture in a form of a comb exhibiting a haft and teeth, said teeth being perpendicular to a direction of propagation of the acoustic waves of the surface wave device.

3. Surface wave component according to claim 2, wherein the anisotropic conductive adhesive is deposited at a level of the teeth of the comb.

4. Surface wave component according to claim 1, wherein the local thickenings are of an order of a few tens of microns.

5. Surface wave component according to claim 1, wherein the anisotropic conductive adhesive is a composite material comprising conducting particles and a binder material.

6. Surface wave component according to claim 5, wherein the binder material is a thermosetting or thermoplastic polymer.

7. Surface wave component according to claim 5, wherein the conducting particles are metallized polymer particles.

8. Surface wave component according to claim 5, wherein the conducting particles are metal particles.

9. Surface wave component according to claim 5, wherein the particles have a diameter of between around a few microns and about twenty microns.

10. Surface wave component according to claim 1, wherein the anisotropic conductive adhesive possesses acoustic absorbent properties.

11. Surface wave component according to claim 1, wherein the conducting anisotropic adhesive is also situated on an entire periphery of the surface wave device in such a way as to achieve encapsulation of the surface wave device.

* * * * *